United States Patent
Huang et al.

(10) Patent No.: US 7,956,775 B2
(45) Date of Patent: Jun. 7, 2011

(54) BACKWARD COMPRESSION SYSTEM AND METHOD

(75) Inventors: Ing-Jer Huang, Kaohsiung (TW); Fu-Ching Yang, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 43 days.

(21) Appl. No.: 12/512,691

(22) Filed: Jul. 30, 2009

(65) Prior Publication Data
US 2010/0117874 A1      May 13, 2010

(30) Foreign Application Priority Data

Nov. 10, 2008   (TW) ............................... 97143334 A

(51) Int. Cl.
*H03M 7/30* (2006.01)
(52) U.S. Cl. ........................................ 341/76; 341/50
(58) Field of Classification Search .................. 341/50, 341/5, 76, 79, 65, 107
See application file for complete search history.

(56) References Cited

U.S. PATENT DOCUMENTS 6,195,024 B1 * 2/2001 Fallon .............................. 341/51
6,281,816 B1 * 8/2001 Kampf .............................. 341/87

OTHER PUBLICATIONS

Fu-Ching Yang et al, A Realtime Backward on-chip bus Trace Compression Algorithm for Efficient Circular Buffer Utilization, Department of Computer Science and Engineering, National Sun Yat-sen University, (2009).

* cited by examiner

*Primary Examiner* — Brian Young
(74) *Attorney, Agent, or Firm* — WPAT, P.C.; Anthony King

(57) ABSTRACT

A backward compression system and a backward compression method are provided. By using the system and the method, under limited memory space, a relationship between input data and previous data is identified in real time, the input data or previous data is encoded according to the relationship, and the order of data output is such that the encoded data is output first and the complete data is output second. When the output data is stored in circular memory and the memory gets full, the oldest encoded data is overwritten first, and the complete data is not overwritten until all the related encoded data is overwritten. Therefore, more original data can be preserved after decompression. Thus, system signals can be compressed and utilization of limited memory space can be improved.

16 Claims, 5 Drawing Sheets

BACKWARD COMPRESSION SYSTEM AND METHOD

BACKGROUND OF THE INVENTION

1. Field of the Invention

The presented invention relates to a data compression system and a data compression method, and more particularly to a backward compression system and a backward compression method.

2. Description of the Related Art

A complicated system-on-chip (SoC), as shown in FIG. 1, includes active devices such as a microprocessor 10, a digital signal processor 11, and a direct memory accessor 14, and passive devices such as a hardware accelerator 15, an on-chip memory 12, and an external output interface 13. These devices are connected with an on-chip bus 18 to communicate with each other.

Since the on-chip operations are complicated, it is important to learn about the chip's internal operations in order to debug and analyze the chip performance. The most intuitive approach would be to connect interested signals to the chip output pins. However, since a large number of signals need to be observed and chip pins are limited, this approach is generally impractical.

In view of the above, a commonly used method is to place a real-time tracer 16 in a chip to capture signals in real time and store the captured signals in the limited spaced on-chip trace memory 17. After a tracing finishes, a decompression process is performed by the external software in an off-line manner to recover the signals. As the memory space is limited, in a related conventional method a compression function is added to the real-time tracer to increase the volume of traced information in the limited space.

In US Patent Publication No. 2004/0103399 and No. 2007/0094645, program addresses of a microprocessor are compressed. Specifically, a complete address is first recorded, and then only the difference between subsequent data and the complete data need to be recorded. Furthermore, in US Patent Publication No. 2006/0212761 and No. 2003/0126358, a memory is used for compression. Specifically, if the input data is not found in the memory, complete input data needs to be recorded and input to memory; and if the input data is found in memory, only a serial number of the data in the memory needs to be recorded to achieve compression.

The above compression method is performed based on data relationship. First, complete data is stored, and then only the relationship between subsequent data and the complete data needs to be recorded. Since the Relationship, for example, a difference or serial number, requires little storage space, the purpose of compression is achieved. Taking Table 1 as an example, an instruction address appears in a sequence of t to (t+4), and each instruction occupies 32 bits. According to a data difference compression method, the data 0x80000234 at a time point t is recorded as complete data, a difference of +0x4 between the data at a time point (t+1) and the data at the time point t is recorded, a difference of +0x4 between the data at a time point (t+2) and the data at the time point (t+1) is recorded, and data at time points (t+3) and (t+4) are processed in the same manner. As the difference only occupies 4 bits, memory space is conserved.

TABLE 1

| Time | Original data | Required bit number | Compressed data | Required bit number |
|------|---------------|---------------------|-----------------|---------------------|
| t    | 0x80000234    | 32                  | 0x80000234      | 32                  |
| t + 1| 0x80000238    | 32                  | +0x4            | 4                   |
| t + 2| 0x8000023C    | 32                  | +0x4            | 4                   |
| t + 3| 0x80000240    | 32                  | +0x4            | 4                   |
| t + 4| 0x80000244    | 32                  | +0x4            | 4                   |

However, the conventional compression method has disadvantages. When the complete data is lost, the related data based on the complete data can no longer be recovered. For example, if the data at the time point t in Table 1 is lost, none of the data at the time points (t+2) to (t+5) compressed based on the relationship with the complete data can be recovered. This restriction prevents memory with limited storage capacity from being circularly utilized. Moreover, in order to circularly utilize the memory, the oldest data must be replaced by the latest data. Memory is cleared to re-trace the compressed data, which causes the traced data to be discontinuous.

In a complicated system, it is critical for system debugging to trace data continuously, as it is difficult to predict when the system fails, and it is impossible to preset a time to start tracing and recording system signals. Therefore, the optimal method is to record the system signals continuously and maintain the currently recorded system signals as the latest data under a limited memory space. Thus, when an error occurs, the system signals prior to the error can be completely recovered for diagnosis.

Although the aforementioned conventional method can be realized by using circular memory without compression, the data volume of system signals is enormous, and the number of signals that can be traced is greatly reduced if the data is not compressed. Therefore, there is a need for an innovative and inventive data compression system and data compression method to solve the above problems.

SUMMARY OF THE INVENTION

The present invention provides a backward compression system, which includes a registering device, an encoding device, and an output selecting device. The registering device is used for storing an input data and outputting a registered data. The encoding device is used for identifying a relationship between the input data and the registered data, encoding the registered data according to the relationship, and outputting an encoded data. The output selecting device is used for selectively outputting the encoded data or the registered data.

The present invention further provides a backward compression system, which includes a registering device, an encoding device, and an output selecting device. The registering device is used for storing at least one input data and outputting at least one registered data. The encoding device identifies a relationship between the input data and the registered data, encodes the input data according to the relationship, and outputs an encoded data. The output selecting device selectively outputs the encoded data or the registered data.

The present invention further provides a backward compression method. The method includes: (a) identifying a relationship between an input data and a registered data; (b) encoding the registered data according to the relationship, and outputting an encoded data; and (c) selectively outputting the encoded data or the registered data.

The present invention further provides a backward compression method. The method includes: (a) identifying a relationship between an input data and at least one registered data; (b) encoding the input data according to the relationship, and outputting an encoded data; and (c) selectively outputting the encoded data or the registered data.

By using the system and method of the present invention, under limited memory space, a relationship between an input data and a previous data is identified in real time, the input data or the previous data are encoded according to the relationship, and the order of data output is such that the encoded data is output first and the complete data is output second. When the output data is stored in circular memory and the memory gets full, the oldest encoded data is overwritten first, and the complete data is not overwritten until all the related encoded data is overwritten. Therefore, more original data can be preserved through decompression. Thus, the present invention is capable of compressing system signals and improving utilization of limited memory space.

DETAILED DESCRIPTION OF THE INVENTION

Figure 1:
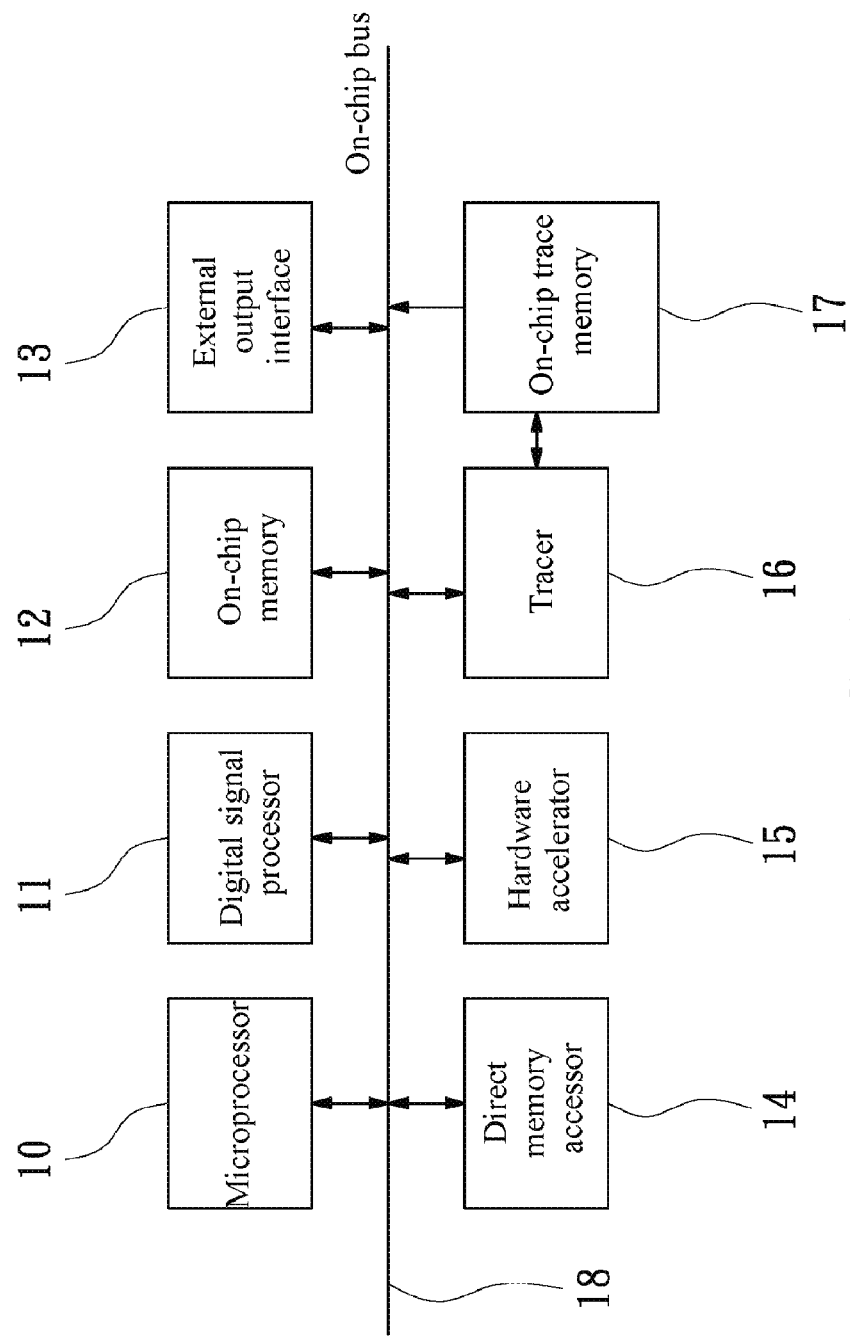
FIG. 1 is a schematic block diagram of a conventional SoC.
Figure 2:
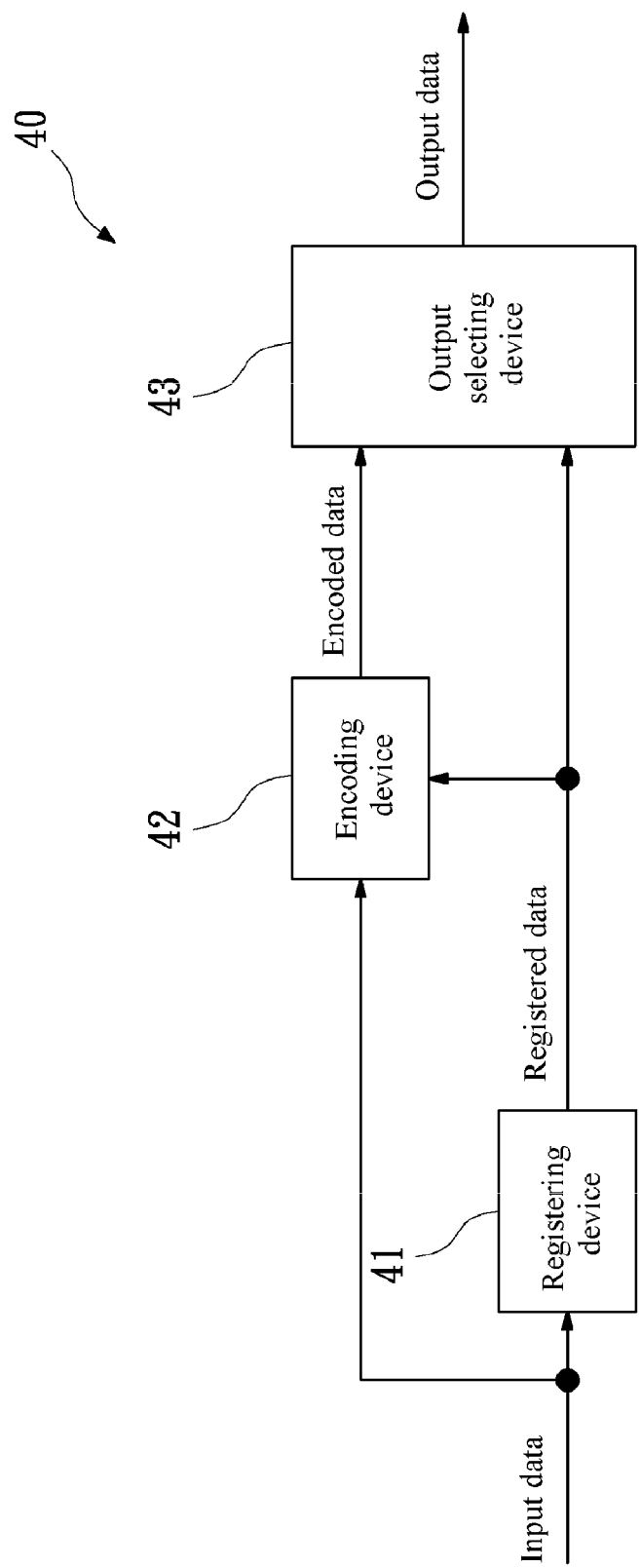
FIG. 2 is a schematic view of a backward compression system according to the present invention.

FIG. 2 is a schematic view of a backward compression system according to the present invention. Referring to FIG. 2, a backward compression system 40 of the present invention includes a registering device 41, an encoding device 42, and an output selecting device 43. The registering device 41 is used for storing an input data and outputting a registered data. The encoding device 42 is used for identifying a relationship between the input data and the registered data, encoding the input data or the registered data according to the relationship, and outputting an encoded data. The output selecting device 43 is used for selectively outputting the encoded data or the registered data. The backward compression system 40 of the present invention first outputs the encoded data and then outputs the registered data. When the output data is stored in circular memory and the memory gets full, data overwritten occurs. The oldest encoded data is overwritten first, and the complete data is not overwritten until all the related encoded data is overwritten. Therefore, more original data can be recovered after decompression. Thus, the present invention is capable of compressing system signals and improving utilization of limited memory space.

Figure 3:
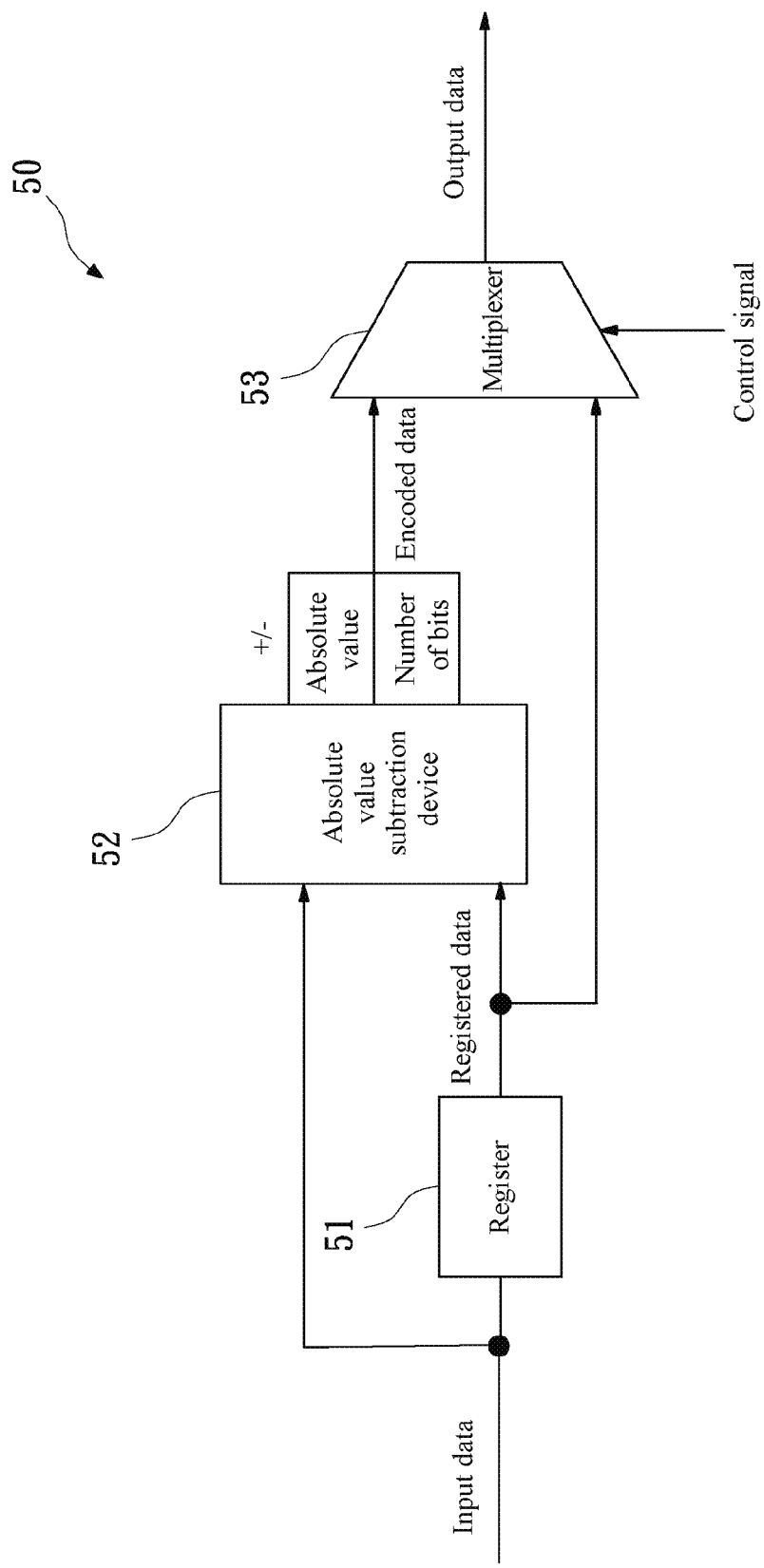
FIG. 3 is a schematic circuit diagram of a backward compression system according to a first embodiment of the present invention.

FIG. 3 is a schematic circuit diagram of a backward compression system 50 according to a first embodiment of the present invention. Referring to FIGS. 2 and 3, in this embodiment, the registering device 41 is a register 51 for storing an input data, and the registered data is an input data previous to the current input data. The encoding device 42 is an absolute value subtraction device 52 for calculating and outputting an absolute difference of the registered data and the input data, a sign of the difference, and a number of bits of the absolute difference. Therefore, the encoded data includes the absolute difference, the sign of the difference, and the number of bits of the absolute difference.

The output selecting device 43 is a multiplexer 53, and the multiplexer 53 selectively outputs the encoded data or the registered data according to a control signal. When the input data and the registered data have a certain relationship, the control signal is asserted, and the multiplexer 53 selectively outputs the encoded data; and when the input data and the registered data have no such relationship, the control signal is not asserted, and the multiplexer 53 selectively outputs the registered data.

Referring to FIG. 3 and Table 2, the backward compression system 50 provided in the first embodiment of the present invention is applied to the compression based on difference relationships. Specifically, an instruction address appears in a time sequence of t to (t+4), and each instruction occupies 32 bits. According to the backward compression system and backward compression method of the present invention, a relationship between an input data and a registered data is first identified. In this embodiment, at a time point (t+1), the input data is 0×80000238, and the registered data is input previously to the current input data, i.e., the input data at a time point t, that is, 0×80000234, and thus, the input data and the registered data have a certain relationship. The registered data (0×80000234) is encoded according to the relationship, and an encoded data is output. In this embodiment, an absolute difference of the registered data and the input data, a sign of the difference, and a number of bits of the absolute difference are calculated and output, and the encoded data includes the absolute difference, the sign of the difference, and the number of bits of the difference. Therefore, a difference between the data at the time point t and the data at the time point (t+1) is –0×4, and the encoded data is –033 4, which is input into the multiplexer 53.

The multiplexer 53 selectively outputs the encoded data or the registered data. When the input data and the registered data have a certain relationship, the control signal is asserted, and the multiplexer selectively outputs the encoded data, so that the data at the time point t is compressed into –0×4. Similarly, data at the time points (t+1), (t+2), and (t+3) are all compressed into –0×4.

When data at a time point (t+5) is input, if the data has no relationship with the data at the time point (t+4), i.e., the input data (the data at the time point (t+5)) and the registered data (the data at the time point (t+4)) have no relationship, the control signal is not asserted, and the multiplexer 53 selectively outputs the registered data. Therefore, the data at the time point (t+4) is not compressed, and is a complete data. As seen from Table 2 and Table 1, the compression ratio of the backward compression method of the present invention is the same as that of the conventional compression method. However, according to the backward compression method of the present invention, when the data at the earliest time point t is lost, the data at the subsequent time points (t+1) to (t+4) may be unaffected, and thus the data can be stored in circular memory. When the memory gets full, the oldest encoded data is overwritten first, and the complete data is not overwritten until all the related encoded data is overwritten. Therefore, more original data can be recovered after decompression. Thus, the present invention is capable of compressing system signals and improving utilization of limited memory space.

TABLE 2

| Time  | Original data | Required bit number | Compressed data | Required bit number |
|-------|---------------|---------------------|-----------------|---------------------|
| t     | 0x80000234    | 32                  | - 0x4           | 4                   |
| t + 1 | 0x80000238    | 32                  | - 0x4           | 4                   |
| t + 2 | 0x8000023C    | 32                  | - 0x4           | 4                   |
| t + 3 | 0x80000240    | 32                  | - 0x4           | 4                   |
| t + 4 | 0x80000244    | 32                  | 0x80000244      | 32                  |

Figure 4:
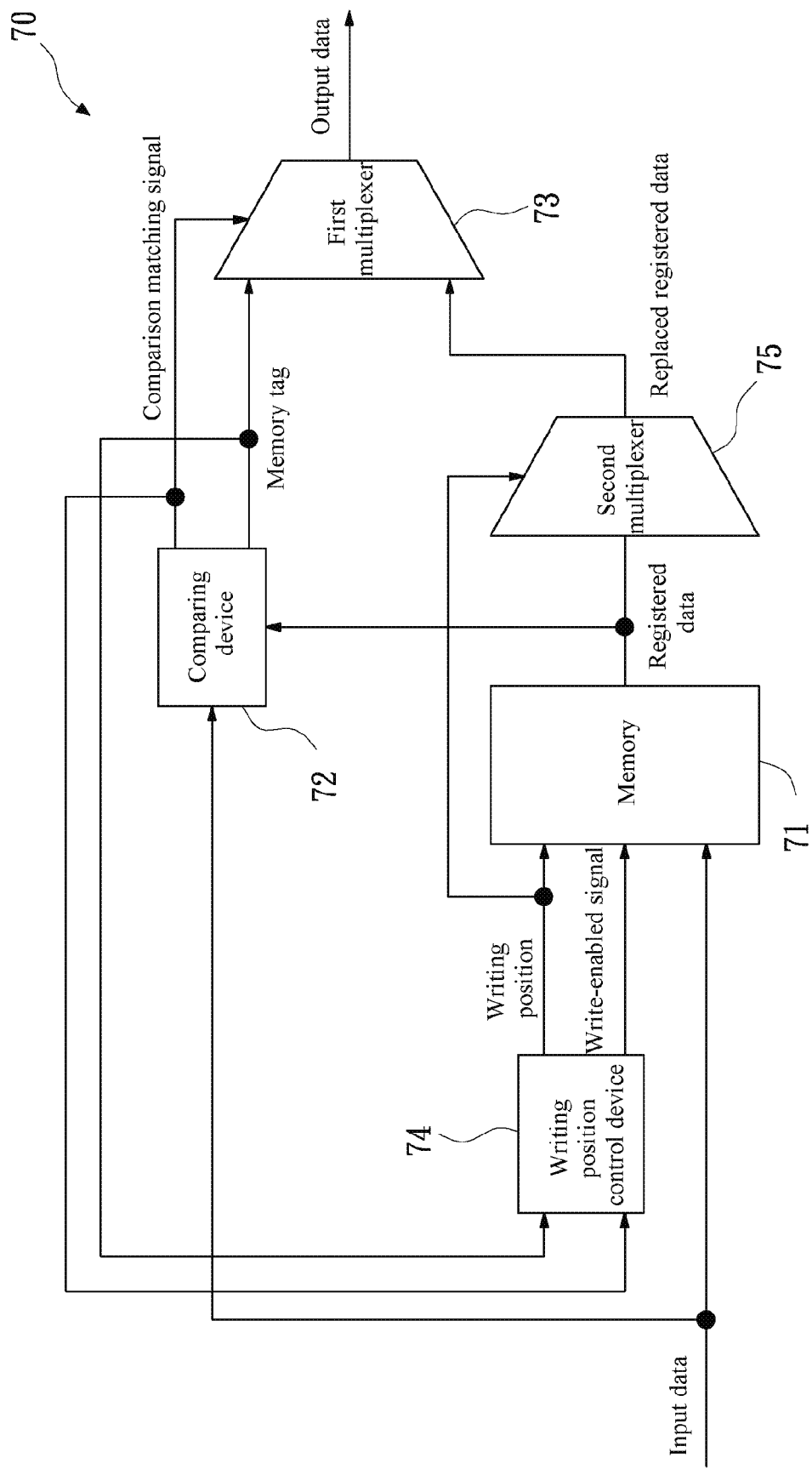
FIG. 4 is a schematic circuit diagram of a backward compression system according to a second embodiment of the present invention.

FIG. 4 is a schematic circuit diagram of a backward compression system 70 according to a second embodiment of the present invention. Referring to FIGS. 2 and 4, in this embodiment, the registering device 41 is a memory 71 for storing at least one input data and outputting the registered data, and the registered data is one of the input data.

The encoding device 42 is a comparing device 72 for determining whether or not the input data is identical to the registered data and outputting a comparison matching signal and a memory tag. The memory tag indicates a position of the registered data in the memory 71, and the encoded data is the memory tag.

The output selecting device 43 is a first multiplexer 73, and the first multiplexer 73 selectively outputs the memory tag or the registered data according to the comparison matching signal. The encoding device 42 further includes a writing position control device 74 and a second multiplexer 75. When it is determined through comparison that the input data is identical to the registered data, the first multiplexer 73 selectively outputs the memory tag according to the comparison matching signal; and when it is determined through comparison that the input data is not identical to the registered data, the writing position control device 74 outputs a writing position and a write-enabled signal to the memory 71 according to the comparison matching signal, the input data is written into the memory 71, and according to the writing position, the second multiplexer 75 receives the registered data in the memory 71 corresponding to the writing position, and outputs the registered data to the first multiplexer 73, so that the first multiplexer 73 selectively outputs the registered data.

Figure 5:
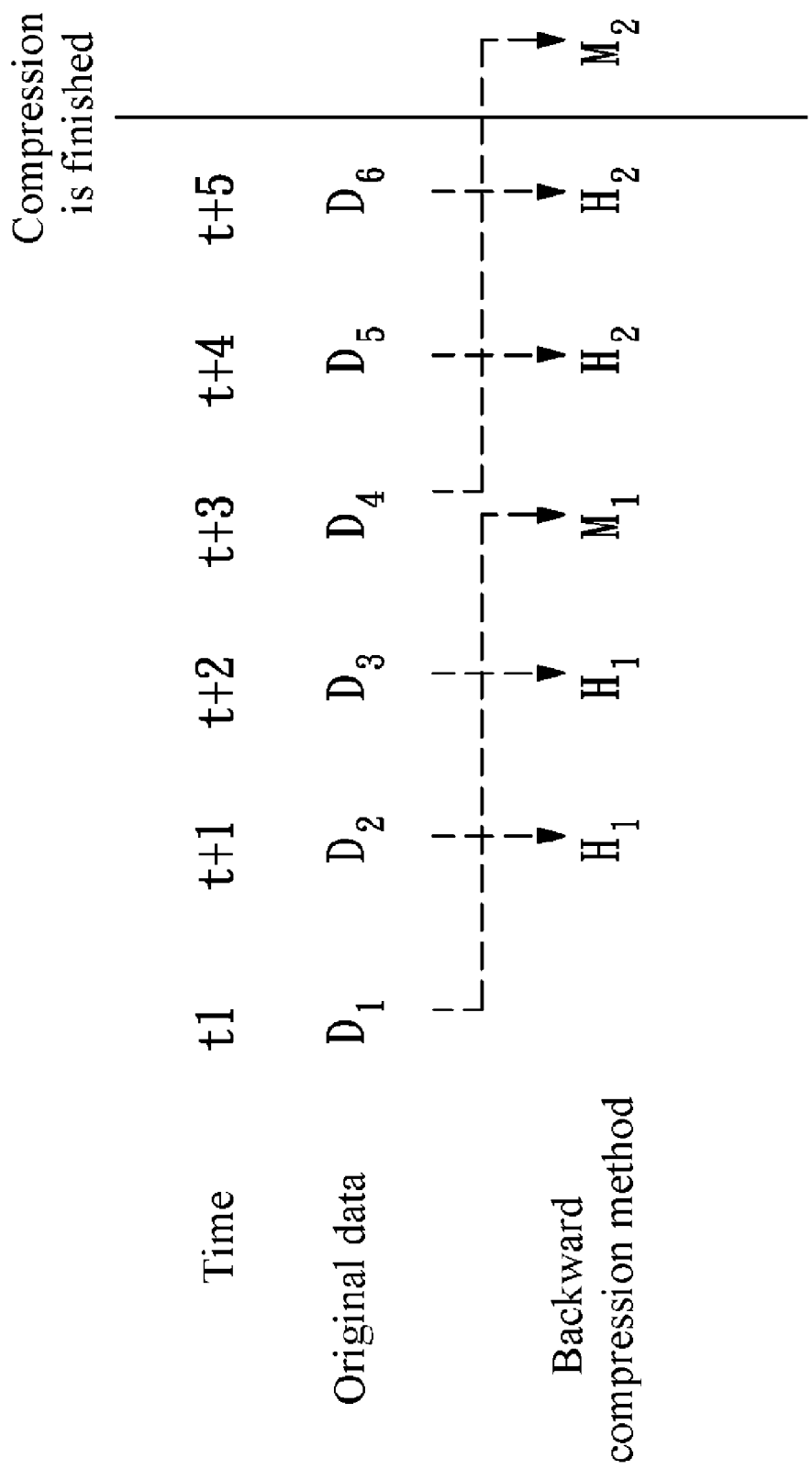
FIG. 5 is a schematic view of an application of the backward compression system according to the second embodiment of the present invention.

Referring to FIGS. 4 and 5, the backward compression system 70 provided in the second embodiment of the present invention is applied to the compression based on repeated relationships. It is assumed that the memory 71 can only store one data. The data appears in a time sequence of t to (t+5), D1, D2, and D3 are identical data, D1 and D4 are different data, and D4, D5, and D6 are identical data.

At a time point t, as the memory 71 has no data identical to D1, D1 is input into the memory 71. At a time point (t+1), a relationship between an input data and at least one registered data is identified. In this embodiment, it is compared to see if the input data D2 is identical to the registered data D1, and a comparison matching signal and a memory tag are output. The memory tag indicates a position of the registered data in the memory, and the encoded data is the memory tag. When it is determined through comparison that the input data D2 is identical to the registered data D1, the memory tag is selectively output according to the comparison matching signal. Therefore, the position of the output data being D1 in the memory 71 is represented by H1. As the bit number occupied by the position is smaller than that occupied by the original data D1, the purpose of compression is achieved. In this manner, the data at the time point (t+2) is also compressed into H1.

When data D4 at a time point (t+3) is input, if the data has no relationship with the data D1 at the time point t, i.e., the input data (the data D4 at the time point (t+3)) is not identical to the registered data (the data D1 at the time point t), a writing position and a write-enabled signal are output to the memory 71 according to the comparison matching signal, the input data D4 is written into the memory 71, and the registered data D1 in the memory corresponding to the writing position is read according to the writing position and selectively output. Therefore, at the time point (t+3), the output data is complete data M1 (M1=D1).

In view of the above, the input data D5 and D6 at time points (t+4) and (t+5) are identical to the data D4 at the time point (t+3), so that the data D5 and D6 are compressed into H2. Finally, after the compression is finished, the data in the memory 71 is output and represented by M2 (M2=D4).

When the output data is stored in circular memory and the memory gets full, the oldest encoded data is overwritten first, and the complete data is not overwritten until all the related encoded data is overwritten. Therefore, more original data can be preserved after decompression. Thus, the present invention is capable of compressing system signals and improving utilization of limited memory space.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A backward compression system, comprising:
   a registering device, for storing an input data, and outputting a registered data;
   an encoding device, for identifying a relationship between the input data and the registered data, encoding the registered data according to the relationship, and outputting an encoded data;
   an output selecting device, for selectively outputting the encoded data or the registered data; and
   wherein the registered data is a previous input data previously to the current input data.

2. The backward compression system according to claim 1, wherein the encoding device is an absolute value subtraction device for calculating and outputting an absolute difference of the registered data and the input data, a sign of the difference, and the number of bits of the absolute difference, and the encoded data comprises the absolute difference, the sign of the difference, and the number of bits of the absolute difference.

3. The backward compression system according to claim 2, wherein the output selecting device is a multiplexer and the multiplexer selectively outputs the encoded data or the registered data according to a control signal.

4. The backward compression system according to claim 3, wherein when the input data and the registered data have a certain relationship, the control signal is asserted, and the multiplexer selectively outputs the encoded data; and when the input data and the registered data have no relationship, the control signal is not asserted, and the multiplexer selectively outputs the registered data.

5. A backward compression system, comprising:
   a registering device, for storing at least one input data, and outputting at least one registered data;
   an encoding device, for identifying a relationship between the input data and the registered data, encoding the input data according to the relationship, and outputting an encoded data;

an output selecting device, for selectively outputting the encoded data or the registered data; and wherein the registering device is a memory for storing at least one input data and outputting the registered data, and the registered data is one of the input data.

6. The backward compression system according to claim 5, wherein the encoding device is a comparing device for determining whether or not the input data is identical to the registered data and outputting a comparison matching signal and a memory tag, the memory tag indicates a position of the registered data in the memory, and the encoded data is the memory tag.

7. The backward compression system according to claim 6, wherein the output selecting device is a first multiplexer, and the first multiplexer selectively outputs the memory tag or the registered data according to the comparison matching signal.

8. The backward compression system according to claim 7, wherein the encoding device further comprises a writing position control device and a second multiplexer, when it is determined through comparison that the input data is identical to the registered data, the first multiplexer selectively outputs the memory tag according to the comparison matching signal; and when it is determined through comparison that the input data is not identical to the registered data, the writing position control device outputs a writing position and a write-enabled signal to the memory according to the comparison matching signal, the input data is written into the memory, and according to the writing position, the second multiplexer receives the registered data in the memory corresponding to the writing position, and outputs the registered data to the first multiplexer, so that the first multiplexer selectively outputs the registered data.

9. A backward compression method, comprising:
  (a) identifying a relationship between an input data and a registered data, wherein the registered data is a previous input data previously to the current input data;
  (b) encoding the registered data according to the relationship, and outputting an encoded data; and
  (c) selectively outputting the encoded data or the registered data.

10. The backward compression method according to claim 9, wherein Step (b) further comprises a calculating step, for calculating and outputting an absolute difference of the registered data and the input data, a sign of the difference, and a number of bits of the absolute difference, and the encoded data comprises the absolute difference, the sign of the difference, and the number of bits of the absolute difference.

11. The backward compression method according to claim 10, wherein in Step (c), the encoded data or the registered data is selectively output according to a control signal.

12. The backward compression method according to claim 11, wherein in Step (c), when the input data and the registered data have a certain relationship, the control signal is asserted, and the encoded data is selectively output; and when the input data and the registered data have no relationship, the control signal is not asserted, and the registered data is selectively output.

13. A backward compression method, comprising:
  (a) identifying a relationship between an input data and at least one registered data, wherein at least one input data is stored in a memory, the registered data is output, and the registered data is one of the input data;
  (b) encoding the input data according to the relationship, and outputting an encoded data; and
  (c) selectively outputting the encoded data or the registered data.

14. The backward compression method according to claim 13, wherein a comparison is performed to determine whether or not the input data is identical to the registered data in Step (a), and a comparison matching signal and a memory tag are output in Step (b), the memory tag indicates a position of the registered data in the memory, and the encoded data is the memory tag.

15. The backward compression method according to claim 14, wherein in Step (c), the memory tag or the registered data is selectively output according to the comparison matching signal.

16. The backward compression method according to claim 15, wherein Step (b) further comprises a writing position control step and a registered data reading step; when it is determined through comparison that the input data is identical to the registered data, the memory tag is selectively output according to the comparison matching signal; and when it is determined through comparison that the input data is not identical to the registered data, a writing position and a write-enabled signal are output to the memory according to the comparison matching signal, the input data is written into the memory, and the registered data in the memory corresponding to the writing position is read according to the writing position and selectively output.

* * * * *